United States Patent
Matsumoto

(10) Patent No.: US 7,516,388 B2
(45) Date of Patent: *Apr. 7, 2009

(54) LDPC CODE INSPECTION MATRIX GENERATION METHOD

(75) Inventor: Wataru Matsumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 735 days.

This patent is subject to a terminal disclaimer.

(21) Appl. No.: 10/482,484

(22) PCT Filed: Dec. 25, 2002

(86) PCT No.: PCT/JP02/13518

§ 371 (c)(1),
(2), (4) Date: Dec. 31, 2003

(87) PCT Pub. No.: WO03/056705

PCT Pub. Date: Jul. 10, 2003

(65) Prior Publication Data

US 2004/0186992 A1    Sep. 23, 2004

(30) Foreign Application Priority Data

Dec. 27, 2001    (JP)    ............... 2001-397922

(51) Int. Cl.
*H03M 13/00*    (2006.01)
(52) U.S. Cl. .................. 714/752; 714/786; 714/801
(58) Field of Classification Search .................. 714/801, 714/752, 758, 781, 786
See application file for complete search history.

(56) References Cited

U.S. PATENT DOCUMENTS

| | | | | |
|---|---|---|---|---|
| 6,307,487 B1 * | 10/2001 | Luby | ........................... | 341/50 |
| 6,567,465 B2 * | 5/2003 | Goldstein et al. | ........... | 375/222 |
| 6,614,366 B2 * | 9/2003 | Luby | ........................... | 341/50 |
| 6,757,122 B1 * | 6/2004 | Kuznetsov et al. | ............ | 360/53 |
| 6,789,227 B2 * | 9/2004 | De Souza et al. | ........... | 714/804 |

FOREIGN PATENT DOCUMENTS

| | | |
|---|---|---|
| EP | 1258999 A2 | 11/2002 |
| EP | 1 480 346 A1 | 11/2004 |
| EP | 1 526 647 A1 | 4/2005 |
| JP | 2001-168733 A | 6/2001 |

OTHER PUBLICATIONS

Sason, I. et al., "On Improved Bounds on the Decoding Error Probability...," IEEE Transactions on Inf. Theory, Sep. 2001, vol. 47, No. 6, pp. 2275-2299.

(Continued)

*Primary Examiner*—Esaw T Abraham
(74) *Attorney, Agent, or Firm*—Birch, Stewart, Kolasch & Birch, LLP

(57) ABSTRACT

A method of generating check matrixes for LDPC codes includes analyzing a "Sum-Product Algorithm" for Low-Density Parity-Check codes, on the assumption that a Log Likelihood Ratio between input/output data at a decoder can be approximated in a Gaussian distribution; fixing a coding rate; obtaining an optimal ensemble, which is an ensemble that minimizes the threshold of SNR, of row and column weights in one linear programming to maximize a Gaussian noise; and generating a check matrix for LDPC codes in accordance with the ensemble obtained.

14 Claims, 13 Drawing Sheets

OTHER PUBLICATIONS

Richardson, et al., "Efficient Encoding of Low-Density Parity-Check Codes," IEEE Transactions on Inf. Theory, Feb. 2001, vol. 47, No. 2, pp. 638-656.

Yongyi, et al., "A Heuristic for Good Low-Density Parity-Check Codes at Short Lengths," IEEE Int'l. Conf. on Comm., 2001. ICC2001. Jun. 2001, vol. 1, pp. 41-44.

Chiani, et al., "Design and Performance Evaluation of Some High-Rate Irregular . . . ," IEEE Global Telecom. Conf., 2001. GLOBECOM'01., Nov. 2001, vol. 2, pp. 990-994.

Y. Kou et al., "Low Density Parity Check Codes Based on Finite Geometries: A Rediscovery," ISIT 2000, pp. 200, Sorrento, Italy, Jun. 25 to 30, 2000.

M. Luby et al., "Improved Low Density Parity Check Codes Using Irregular Graphs and Belief Propagation," Proceedings of 1998 IEEE International Symposium on Information Theory, pp. 171, Cambridge, Mass., Aug. 16 to 21, 1998.

T. Richardson et al., "The Capacity of Low-Density Parity Check Codes Under Message-Passing Decoding," IEEE Transactions on Information Theory, vol. 47, No. 2, Feb. 2001, pp. 599-618.

S-Y. Chung, et al., "Analysis of Sum-Product Decoding of Low-Density Parity-Check Codes Using a Gaussian Approximation," IEEE Transactions on Information Theory, vol. 47, No. 2, pp. 657-670, Feb. 2001.

Chung S.-Y. et al: "Analysis of Sum-Product Decoding of Low-Density Parity-Check Codes Using a Gaussian Approximation" IEEE Transactions on Information Theory, vol. 47, No. 2, Feb. 2001, pp. 657-670, XP022027864; ISSN: 0018-9448.

Luby M. G. et al: "Analysis of Low Density Codes and Improved Designs Usign Irregular Graphs" Proc., 30th Annual ACM Symposium on Theory of Computing. Dallas, TX, May 23, 1998, pp. 249-258, XP000970907; ISBN 0-89791-962-9.

Luby M. et al: "Improved Low-Density Parity-Check Codes Using Irregular Graphs" IEEE Transactions on Information Theory, vol. 47, No. 2, Feb. 2001, XP011027875; ISSN 0018-9448.

Matsumoto W. et al: "Irregular extended Euclidean geometry low-density parity-check codes" Proc., International Symposium on Communication Systems Networks and Digital Signal Processing, CSNDSP 2002, Stafford, UK, Jul. 15, 2002, pp. 148-151, XP002370884.

Richardson T.J. et al.: "Design of Capacity-Approaching Irregular Low-Density Parity-Check Codes" IEEE Transactions on Information Theory, vol. 47, No. 2, Feb. 2001, XP011027879; ISSN 0018-9448.

Yu Kou et al: "Low-Density Parity-Check Codes Based on Finite Geometries: A Rediscovery and New Results" IEEE Transactions on Information Theory, IEEE Service Center, Piscataway, NJ, US, vol. 47, No. 7, Nov. 2001, XP011028087; ISSN 0018-9448.

\* cited by examiner

| $d_l$ | | 32 |
|---|---|---|
| rate | | 0.5 |
| | x | $\lambda_x$ |
| | 2 | 0.178783 |
| | 3 | 0.149148 |
| | 6 | 0.019896 |
| | 7 | 0.220144 |
| | 8 | 0.005388 |
| | 32 | 0.426641 |
| | x | $\rho_x$ |
| | 10 | 0.333333 |
| | 11 | 0.666667 |
| $\sigma_{GA}$ | | 0.962089 |
| $SNR_{norm}(GA)$ | | 0.1486 dB |

FIG.4

| | | | | | | | | | | |
|---|---|---|---|---|---|---|---|---|---|---|
| | x | λx | | | | | | | x | λx |
| CHECK NODE (COLUMN) | 2 | 0.178783 | 5852.64 | 2926.32 | 2926 | 5852 | 5846 | 2923 | 2 | 0.178580156 |
| | 3 | 0.149148 | 4882.509 | 1627.503 | 1628 | 4884 | 4890 | 1630 | 3 | 0.149376833 |
| | 6 | 0.019896 | 651.3155 | 108.5526 | 109 | 654 | 660 | 110 | 6 | 0.02016129 |
| | 7 | 0.220144 | 7206.634 | 1029.519 | 1030 | 7210 | 7196 | 1028 | 7 | 0.219819159 |
| | 8 | 0.005388 | 176.3816 | 22.0477 | 22 | 176 | 192 | 24 | 8 | 0.005865103 |
| | 32 | 0.426641 | 13966.52 | 436.4537 | 436 | 13952 | 13952 | 436 | 32 | 0.426197458 |
| TOTAL | | 1 | 32736 | 6150.396 | 6151 | 32728 | 32736 | 6151 | | 1 |
| | x | ρx | | | | | | | x | ρx |
| VARIABLE NODE(ROW) | 10 | 0.3125 | 10230 | 1023 | 1023 | 10230 | 10230 | 1023 | 10 | 0.3125 |
| | 11 | 0.6875 | 22506 | 2046 | 2046 | 22506 | 22506 | 2046 | 11 | 0.6875 |
| TOTAL | | 1 | 32736 | 3069 | 3069 | 32736 | 32736 | 3069 | | 1 |
| rate | | 0.501007762 | | | | | | | | 0.501056739 |

· THE TOTAL NUMBER OF "1"S IN MATRIX, TP = 1023 × 32 = 32736

FIG.5

| $d_l$ | 32 | | |
|---|---|---|---|
| rate | 0.5 | | |
| | x | $\lambda_x$ | No. |
| | 2 | 0.178580156 | 2923 |
| | 3 | 0.149376833 | 1630 |
| | 6 | 0.02016129 | 110 |
| | 7 | 0.219819159 | 1028 |
| | 8 | 0.005865103 | 24 |
| | 32 | 0.426197458 | 436 |
| | x | $\rho_x$ | No. |
| | 10 | 0.333333 | 1023 |
| | 11 | 0.666667 | 2046 |
| $\sigma_{GA}$ | 0.962089 | | |
| $SNR_{norm}(GA)$ | 0.1486 dB | | |

FIG.6

Original EG(2,2$^5$)code (=) : VARIABLE NODE (+) : CHECK NODE

FIG.10

| $d_l$ | 32 | | |
|---|---|---|---|
| rate | 0.5 | | |
| | x | $\lambda_x$ | No. |
| | 16 | 1 | 2046 |
| | x | $\rho_x$ | No. |
| | 32 | 1 | 1023 |

FIG.11

| $d_l$ | 32 | | |
|---|---|---|---|
| rate | 0.5 | | |
| | x | $\lambda_x$ | No. |
| | 2 | 0.178580156 | 2923 |
| | 3 | 0.149376833 | 1630 |
| | 6 | 0.02016129 | 110 |
| | 7 | 0.219819159 | 1028 |
| | 8 | 0.005865103 | 24 |
| | 32 | 0.426197458 | 436 |
| | x | $\rho_x$ | No. |
| | 10 | 0.3125 | 1023 |
| | 11 | 0.6875 | 2046 |

| q | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|
| $L_k(1)$ | 32 | 22 | 1 | 8 | 24 | 19 | 7 | 3 | 12 | 15 | 16 | 6 | 13 | 5 | 23 | 29 | 31 | 11 | 25 | 9 | 14 | 26 | 30 | 21 | 18 | 17 | 27 | 20 | 28 | 10 | 4 | 2 |
| $L_k(2)$ | 2 | 32 | 22 | 1 | 8 | 24 | 19 | 7 | 3 | 12 | 15 | 16 | 6 | 13 | 5 | 23 | 29 | 31 | 11 | 25 | 9 | 14 | 26 | 30 | 21 | 18 | 17 | 27 | 20 | 28 | 10 | 4 |
| $L_k(3)$ | 4 | 2 | 32 | 22 | 1 | 8 | 24 | 19 | 7 | 3 | 12 | 15 | 16 | 6 | 13 | 5 | 23 | 29 | 31 | 11 | 25 | 9 | 14 | 26 | 30 | 21 | 18 | 17 | 27 | 20 | 28 | 10 |
| $L_k(4)$ | 10 | 4 | 2 | 32 | 22 | 1 | 8 | 24 | 19 | 7 | 3 | 12 | 15 | 16 | 6 | 13 | 5 | 23 | 29 | 31 | 11 | 25 | 9 | 14 | 26 | 30 | 21 | 18 | 17 | 27 | 20 | 28 |
| $L_k(5)$ | 28 | 10 | 4 | 2 | 32 | 22 | 1 | 8 | 24 | 19 | 7 | 3 | 12 | 15 | 16 | 6 | 13 | 5 | 23 | 29 | 31 | 11 | 25 | 9 | 14 | 26 | 30 | 21 | 18 | 17 | 27 | 20 |
| $L_k(6)$ | 20 | 28 | 10 | 4 | 2 | 32 | 22 | 1 | 8 | 24 | 19 | 7 | 3 | 12 | 15 | 16 | 6 | 13 | 5 | 23 | 29 | 31 | 11 | 25 | 9 | 14 | 26 | 30 | 21 | 18 | 17 | 27 |
| $L_k(7)$ | 27 | 20 | 28 | 10 | 4 | 2 | 32 | 22 | 1 | 8 | 24 | 19 | 7 | 3 | 12 | 15 | 16 | 6 | 13 | 5 | 23 | 29 | 31 | 11 | 25 | 9 | 14 | 26 | 30 | 21 | 18 | 17 |
| $L_k(8)$ | 17 | 27 | 20 | 28 | 10 | 4 | 2 | 32 | 22 | 1 | 8 | 24 | 19 | 7 | 3 | 12 | 15 | 16 | 6 | 13 | 5 | 23 | 29 | 31 | 11 | 25 | 9 | 14 | 26 | 30 | 21 | 18 |
| $L_k(9)$ | 18 | 17 | 27 | 20 | 28 | 10 | 4 | 2 | 32 | 22 | 1 | 8 | 24 | 19 | 7 | 3 | 12 | 15 | 16 | 6 | 13 | 5 | 23 | 29 | 31 | 11 | 25 | 9 | 14 | 26 | 30 | 21 |
| $L_k(10)$ | 21 | 18 | 17 | 27 | 20 | 28 | 10 | 4 | 2 | 32 | 22 | 1 | 8 | 24 | 19 | 7 | 3 | 12 | 15 | 16 | 6 | 13 | 5 | 23 | 29 | 31 | 11 | 25 | 9 | 14 | 26 | 30 |
| $L_k(11)$ | 30 | 21 | 18 | 17 | 27 | 20 | 28 | 10 | 4 | 2 | 32 | 22 | 1 | 8 | 24 | 19 | 7 | 3 | 12 | 15 | 16 | 6 | 13 | 5 | 23 | 29 | 31 | 11 | 25 | 9 | 14 | 26 |
| $L_k(12)$ | 26 | 30 | 21 | 18 | 17 | 27 | 20 | 28 | 10 | 4 | 2 | 32 | 22 | 1 | 8 | 24 | 19 | 7 | 3 | 12 | 15 | 16 | 6 | 13 | 5 | 23 | 29 | 31 | 11 | 25 | 9 | 14 |
| $L_k(13)$ | 14 | 26 | 30 | 21 | 18 | 17 | 27 | 20 | 28 | 10 | 4 | 2 | 32 | 22 | 1 | 8 | 24 | 19 | 7 | 3 | 12 | 15 | 16 | 6 | 13 | 5 | 23 | 29 | 31 | 11 | 25 | 9 |
| $L_k(14)$ | 9 | 14 | 26 | 30 | 21 | 18 | 17 | 27 | 20 | 28 | 10 | 4 | 2 | 32 | 22 | 1 | 8 | 24 | 19 | 7 | 3 | 12 | 15 | 16 | 6 | 13 | 5 | 23 | 29 | 31 | 11 | 25 |
| $L_k(15)$ | 25 | 9 | 14 | 26 | 30 | 21 | 18 | 17 | 27 | 20 | 28 | 10 | 4 | 2 | 32 | 22 | 1 | 8 | 24 | 19 | 7 | 3 | 12 | 15 | 16 | 6 | 13 | 5 | 23 | 29 | 31 | 11 |
| $L_k(16)$ | 11 | 25 | 9 | 14 | 26 | 30 | 21 | 18 | 17 | 27 | 20 | 28 | 10 | 4 | 2 | 32 | 22 | 1 | 8 | 24 | 19 | 7 | 3 | 12 | 15 | 16 | 6 | 13 | 5 | 23 | 29 | 31 |
| $L_k(17)$ | 31 | 11 | 25 | 9 | 14 | 26 | 30 | 21 | 18 | 17 | 27 | 20 | 28 | 10 | 4 | 2 | 32 | 22 | 1 | 8 | 24 | 19 | 7 | 3 | 12 | 15 | 16 | 6 | 13 | 5 | 23 | 29 |
| $L_k(18)$ | 29 | 31 | 11 | 25 | 9 | 14 | 26 | 30 | 21 | 18 | 17 | 27 | 20 | 28 | 10 | 4 | 2 | 32 | 22 | 1 | 8 | 24 | 19 | 7 | 3 | 12 | 15 | 16 | 6 | 13 | 5 | 23 |
| $L_k(19)$ | 23 | 29 | 31 | 11 | 25 | 9 | 14 | 26 | 30 | 21 | 18 | 17 | 27 | 20 | 28 | 10 | 4 | 2 | 32 | 22 | 1 | 8 | 24 | 19 | 7 | 3 | 12 | 15 | 16 | 6 | 13 | 5 |
| $L_k(20)$ | 5 | 23 | 29 | 31 | 11 | 25 | 9 | 14 | 26 | 30 | 21 | 18 | 17 | 27 | 20 | 28 | 10 | 4 | 2 | 32 | 22 | 1 | 8 | 24 | 19 | 7 | 3 | 12 | 15 | 16 | 6 | 13 |
| $L_k(21)$ | 13 | 5 | 23 | 29 | 31 | 11 | 25 | 9 | 14 | 26 | 30 | 21 | 18 | 17 | 27 | 20 | 28 | 10 | 4 | 2 | 32 | 22 | 1 | 8 | 24 | 19 | 7 | 3 | 12 | 15 | 16 | 6 |
| $L_k(22)$ | 6 | 13 | 5 | 23 | 29 | 31 | 11 | 25 | 9 | 14 | 26 | 30 | 21 | 18 | 17 | 27 | 20 | 28 | 10 | 4 | 2 | 32 | 22 | 1 | 8 | 24 | 19 | 7 | 3 | 12 | 15 | 16 |
| $L_k(23)$ | 16 | 6 | 13 | 5 | 23 | 29 | 31 | 11 | 25 | 9 | 14 | 26 | 30 | 21 | 18 | 17 | 27 | 20 | 28 | 10 | 4 | 2 | 32 | 22 | 1 | 8 | 24 | 19 | 7 | 3 | 12 | 15 |
| $L_k(24)$ | 15 | 16 | 6 | 13 | 5 | 23 | 29 | 31 | 11 | 25 | 9 | 14 | 26 | 30 | 21 | 18 | 17 | 27 | 20 | 28 | 10 | 4 | 2 | 32 | 22 | 1 | 8 | 24 | 19 | 7 | 3 | 12 |
| $L_k(25)$ | 12 | 15 | 16 | 6 | 13 | 5 | 23 | 29 | 31 | 11 | 25 | 9 | 14 | 26 | 30 | 21 | 18 | 17 | 27 | 20 | 28 | 10 | 4 | 2 | 32 | 22 | 1 | 8 | 24 | 19 | 7 | 3 |
| $L_k(26)$ | 3 | 12 | 15 | 16 | 6 | 13 | 5 | 23 | 29 | 31 | 11 | 25 | 9 | 14 | 26 | 30 | 21 | 18 | 17 | 27 | 20 | 28 | 10 | 4 | 2 | 32 | 22 | 1 | 8 | 24 | 19 | 7 |
| $L_k(27)$ | 7 | 3 | 12 | 15 | 16 | 6 | 13 | 5 | 23 | 29 | 31 | 11 | 25 | 9 | 14 | 26 | 30 | 21 | 18 | 17 | 27 | 20 | 28 | 10 | 4 | 2 | 32 | 22 | 1 | 8 | 24 | 19 |
| $L_k(28)$ | 19 | 7 | 3 | 12 | 15 | 16 | 6 | 13 | 5 | 23 | 29 | 31 | 11 | 25 | 9 | 14 | 26 | 30 | 21 | 18 | 17 | 27 | 20 | 28 | 10 | 4 | 2 | 32 | 22 | 1 | 8 | 24 |
| $L_k(29)$ | 24 | 19 | 7 | 3 | 12 | 15 | 16 | 6 | 13 | 5 | 23 | 29 | 31 | 11 | 25 | 9 | 14 | 26 | 30 | 21 | 18 | 17 | 27 | 20 | 28 | 10 | 4 | 2 | 32 | 22 | 1 | 8 |
| $L_k(30)$ | 8 | 24 | 19 | 7 | 3 | 12 | 15 | 16 | 6 | 13 | 5 | 23 | 29 | 31 | 11 | 25 | 9 | 14 | 26 | 30 | 21 | 18 | 17 | 27 | 20 | 28 | 10 | 4 | 2 | 32 | 22 | 1 |
| $L_k(31)$ | 1 | 8 | 24 | 19 | 7 | 3 | 12 | 15 | 16 | 6 | 13 | 5 | 23 | 29 | 31 | 11 | 25 | 9 | 14 | 26 | 30 | 21 | 18 | 17 | 27 | 20 | 28 | 10 | 4 | 2 | 32 | 22 |
| $L_k(32)$ | 22 | 1 | 8 | 24 | 19 | 7 | 3 | 12 | 15 | 16 | 6 | 13 | 5 | 23 | 29 | 31 | 11 | 25 | 9 | 14 | 26 | 30 | 21 | 18 | 17 | 27 | 20 | 28 | 10 | 4 | 2 | 32 |

LDPC CODE INSPECTION MATRIX GENERATION METHOD

TECHNICAL FIELD

The present invention relates to a method of generating check matrixes for Low-Density Parity-Check (hereinafter, "LDPC") codes that are applied in an encoder as error correction codes.

BACKGROUND ART

FIG. 13 illustrates an LDPC encoding/decoding system. Reference numeral 101 denotes an encoder, 102 denotes a modulator, 103 denotes a channel, 104 denotes a demodulator, and 105 denotes a decoder. Prior to explanation of a conventional method of generating check matrixes for LDPC codes, encoding and decoding using LDPC codes are explained first.

At the sending side, the encoder 101 generates a check matrix H using a certain method. Then, a generator matrix G is derived from the following condition.

G: k×n matrix (where k is information-length and n is code-word length)

$GH^T=0$ (where T is transposition)

The encoder 101 then receives a message (m1 m2 ... mk) of an information-length k, and generates a code-word C using the generator matrix G as follows:

$$C = (m1\ m2\ \ldots\ mk)\ G$$
$$= (c1\ c2\ \ldots\ cn)\ (\text{where } H(c1\ c2\ \ldots\ cn)^T = 0).$$

The modulator 102 subjects the generated code-word C to digital modulation such as BPSK, QPSK or multi-valued QAM and transmits the resultant modulated signal.

At the receiving side, the demodulator 104 receives the modulated signal via the channel 103, and subjects it to a digital demodulation such as BPSK, QPSK or multi-valued QAM. The decoder 105 then subjects the LDPC-coded, demodulated result to an iterative decoding by "Sum-Product Algorithm" and provides an estimated result (corresponding to the original m1 m2 ... mk).

Conventionally, check matrixes for the LDPC codes are generated as explained below. The check matrix proposed by Gallager, the proposer of the LDPC, is shown in FIG. 14, as an example.

This matrix is a binary matrix of "1" and "0". Parts of "1" are hatched and parts of "0" are white. There are four "1"s in one row (hereinafter, "row weight"), and there are three "1"s in one column (hereinafter, "column weight"). All columns and rows have respective uniform weights. Thus, it is generally called "Regular-LDPC Code". In the Gallager's codes, as shown in FIG. 14, the matrix is divided into three blocks, for example, and the second and third blocks are subjected to random permutation.

Because the random permutation has no certain rule, it is required to execute a time-consuming search by computer to find codes with a better characteristic.

Euclid geometric codes are such LDPC codes that exhibit a relatively stable and nice characteristic and can definitely generate a matrix without the use of the computer search. Y. Kou et al. (Y. Kou, S. Lin, and M. P. C. Fossorier, "Low Density Parity Check Codes Based on Finite Geometries: A Rediscovery," ISIT 2000, pp. 200, Sorrento, Italy, Jun. 25 to 30, 2000.) have proposed a method using such Euclid geometric codes. This method explains "Regular-LDPC Codes" consisting of regular ensembles.

A method of generating a check matrix for LDPC codes is herein proposed using Euclid geometric codes EG(2, 26) or a kind of finite geometric codes. This method achieves a characteristic that is located closely but 1.45 decibels away from the Shannon limit at an error rate of 10-4. FIG. 15 illustrates a configuration of Euclid geometric codes EG(2, 22), which has a structure of "Regular-LDPC Codes" with row and column weights of 4, 4.

Euclid geometric codes EG(m, 2s) have a characteristic defined as follows:

| | |
|---|---|
| Code length: | n = 22s − 1 |
| Redundant bit length: | n − k = 3s − 1 |
| Information length: | k = 22s − 3s |
| Minimum distance: | dmin = 2s + 1 |
| Density: | r = 2s/(22s − 1). |

As can be seen from FIG. 15, Euclid geometric codes have a structure with a cyclically sifted location of "1" in each row from an adjacent row. This structure can characteristically configure codes easily and definitely.

The check matrix generating method by Y. Kou et al. further includes changing row and column weights based on the Euclid geometric codes to extend rows and columns, if required. For example, when a column weight in EG(2, 22) is separated into halves, in the paper by Y. Kou et al., every other one of four weights located in one column is separated into two groups. FIG. 16 illustrates an exemplary regular separation of the column weight from 4 into 2.

On the other hand, Ludy et al. (M. G. Luby, M. Mitzenmacher, M. A. Shokrollahi, and D. A. Spielman, "Improved Low-Density Parity-Check Codes Using Irregular Graphs and Belief Propagation," Proceedings of 1998 IEEE International Symposium on Information Theory, pp. 171, Cambridge, Mass., Aug. 16 to 21, 1998.) have reported that "Irregular-LDPC Codes" have a better characteristic than that of "Regular-LDPC Codes". The "Irregular-LDPC Codes" represent such LDPC codes that have non-uniformity in either or both of row and column weights.

Richardson et al. (T. J. Richardson and R. Urbanke, "The capacity of low-density parity-check codes under message-passing decoding," IEEE Trans. Inform. Theory, vol. 47, No. 2, pp. 599 to 618, February 2001.) have analyzed it theoretically as well as Chung et al. (S.-Y. Chung, T. J. Richardson, and R. Urbanke, "Analysis of Sum-Product Decoding of Low-Density Parity-Check Codes Using a Gaussian Approximation," IEEE Trans. Inform. Theory, vol. 47, No. 2, pp. 657 to 670, February 2001.)

In particular, Chung et al. analyze a "Sum-Product Algorithm" for LDPC codes, on the assumption that a Log Likelihood Ratio (hereinafter, "LLR") between an input and an output at an iterative decoder can be approximated in a Gaussian distribution, to derive a nice ensemble of row and column weights.

In the conventional method of generating check matrixes for LDPC codes by Chung et al., however, the number of "1" points in a row (corresponding to a degree distribution of variable nodes later described) and the number of "1" points in a column (corresponding to a degree distribution of check nodes later described) are both employed as variables to derive the degree distribution of variable nodes and the degree distribution of check nodes that can maximize the following equation (1) (rate: coding rate). In a word, a linear programming is employed to search an ensemble that minimizes a Signal to Noise Ratio (hereinafter, "SNR").

$$\text{rate} = 1 - \frac{\int_0^1 \rho(x)}{\int_0^1 \lambda(x)} \quad (1)$$

Therefore, a problem arises because a check matrix derived from the maximum of the "rate" has a flux and unstable characteristic. In addition, the conventional method of generating check matrixes for LDPC codes iteratively executes the derivation of the degree distribution of variable nodes and the derivation of the degree distribution of check nodes over certain times. Therefore, a problem arises because it takes time to some extent for searching.

It is an object of the present invention to solve at least the problems in the conventional technology.

DISCLOSURE OF THE INVENTION

The method according to the present invention is a method of generating check matrixes for LDPC codes to derive a threshold of SNR that makes an error 0 by analyzing a "Sum-Product Algorithm" for Low-Density Parity-Check codes, on the assumption that a Log Likelihood Ratio between input/output data at a decoder can be approximated in a Gaussian distribution. The method includes fixing a coding rate; obtaining an optimal ensemble, which is an ensemble that minimizes the threshold of SNR, of row and column weights in one linear programming to maximize a Gaussian noise; and generating a check matrix for LDPC codes in accordance with the ensemble obtained.

BRIEF DESCRIPTION OF THE DRAWINGS

FIG. 4 illustrates a table for adjusting a weight distribution;

FIG. 5 illustrates an ensemble of a generator function $\lambda(x)$ and a generator function $\rho(x)$ after the weight distribution;

FIG. 6 illustrates the conventional dividing procedure;

FIG. 10 illustrates an ensemble of "Regular-LDPC Codes";

FIG. 11 illustrates an ensemble of "Irregular-LDPC Codes";

FIG. 17 illustrates a Latin square of random sequences; and

FIG. 18 illustrates a Latin square of random sequences.

Figures 1, 2:
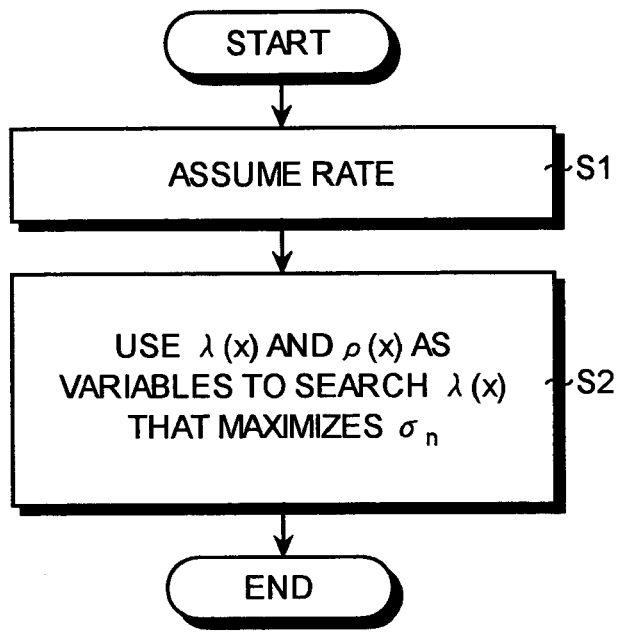
FIG. 1 is a flowchart of a method according to a first embodiment for generating check matrixes for LDPC codes.
FIG. 2 illustrates an ensemble of a generator function $\lambda(x)$ and a generator function $\rho(x)$ when the rate is 0.5.

The other objects, features and advantages of the present invention are specifically set forth in or will become apparent from the following detailed descriptions of the invention when read in conjunction with the accompanying drawings.

BEST MODE FOR CARRYING OUT THE INVENTION

Exemplary embodiments of methods of generating check matrixes for LDPC codes according to the present invention will be explained below with reference to the accompanying drawings. It should be noted that the embodiments are not intended to limit the invention.

Prior to explanation of the method of generating check matrixes for LDPC codes according to the present embodiment, the position of an encoder capable of achieving the method is explained first together with the conventional method of generating check matrixes for "Irregular-LDPC Codes". The LDPC encoding/decoding system has the same configuration as that previously explained in FIG. 13.

At the sending side, the encoder 101 generates a check matrix H using the method of generating check matrixes for LDPC codes according to the present embodiment later described. Then, a generator matrix G is derived from the following condition.

G: k×n matrix (where k is information-length and n is code-word length)

GHT=0 (where T is transposition)

The encoder 101 then receives a message (m1 m2 ... mk) of an information-length k, and generates a code-word C using the generator matrix G.

$$C = (m1\ m2\ ...\ mk)\ G$$
$$= (c1\ c2\ ...\ cn)\ (\text{where } H(c1\ c2\ ...\ cn)T = 0)$$

The modulator 102 subjects the generated code-word C to digital modulation such as BPSK, QPSK or multi-valued QAM and transmits the resultant modulated signal.

At the receiving side, the demodulator 104 receives the modulated signal via the channel 103, and subjects it to a digital demodulation such as BPSK, QPSK or multi-valued QAM. The decoder 105 then subjects the LDPC-coded, demodulated result to an iterative decoding by "Sum-Product Algorithm" and provides an estimated result (corresponding to the original m1 m2 ... mk).

Chung et al. (S. -Y. Chung, T. J. Richardson, and R. Urbanke, "Analysis of Sum-Product Decoding of Low-Density Parity-Check Codes Using a Gaussian Approximation," IEEE Trans. Inform. Theory, vol. 47, No. 2, pp. 657 to 670, February 2001.) have theoretically analyzed the conventional method of generating check matrixes for "Irregular-LDPC Codes". The method is explained here in detail. In this method, a "Sum-Product Algorithm" for LDPC codes is analyzed, on the assumption that a Log Likelihood Ratio (LLR) between an input and an output at an iterative decoder can be approximated in a Gaussian distribution, to derive a nice ensemble of row and column weights.

The method of generating check matrixes for LDPC Codes described in the paper, or Gaussian Approximation, has a premise that defines a point of "1" on a row as a variable node and a point of "1" on a column as a check node in the check matrix.

LLR message propagation from a check node to a variable node is analyzed first. The following equation (2) is defined on condition that $0 < s < \infty$ and $0 \leq t < \infty$. In this case, $s = mu0$ denotes a mean of u0; u0 a Log Likelihood Ratio (LLR) associated with a signal received via a channel containing a Gaussian noise of distributed value σn2; and t an ensemble average of LLR output values at check nodes at the time of certain iteration.

$$fj(s, t) = \phi^{-1}\left(1 - \left[1 - \sum_{i=2}^{d_l} \lambda_i \phi(s + (i-1)t)\right]^{j-1}\right) \quad (2)$$

$$f(s, t) = \sum_{j=2}^{d_r} \rho_j f_j(s, t) \quad$$

λ(x) and ρ(x) respectively denote generator functions of degree distribution associated with variable nodes and check nodes, and can be represented by the equations (3) and (4). (A degree is expressed as the number of "1"s in each row and each column of variable nodes and check nodes). In addition, λi and ρi respectively denote ratios of edges belonging to variable nodes and check nodes at a degree of i. Finally, dl denotes a degree of maximum variable nodes, and dr a degree of maximum check nodes.

$$\lambda(x) = \sum_{i=2}^{d_l} \lambda_i x^{i-1} \quad (3)$$

$$\rho(x) = \sum_{i=2}^{d_r} \rho_i x^{i-1} \quad (4)$$

φ(x) is defined as the following equation (5):

$$\phi(x) = \begin{cases} 1 - \frac{1}{\sqrt{4\pi x}} \int_R \tanh\frac{u}{2} \cdot e^{-\frac{(u-x)^2}{4x}} du & \text{if } x > 0 \\ 1 & \text{if } x \leq 0 \end{cases} \quad (5)$$

The equation (2) can be represented equivalently by the following equation (6):

$$tl = f(s, tl-1) \quad (6)$$

where tl denotes an ensemble average of LLR output values on check nodes at the time of the l-th iteration.

A condition required for deriving an SNR limit (threshold) that provides an error with a value of 0 includes tl(s)→∞ (expressed as R+) when l→∞. In order to satisfy this condition, it is required to satisfy the following conditional expression (7):

$$t < f(s, t), \text{ all } t \in R+ \quad (7)$$

LLR message propagation from a check node to a variable node is analyzed next. The following equation (8) is defined on condition that 0<s<∞ and 0<r≦1. In this case, r has an initial value r0 of φ(s).

$$hi(s, r) = \phi\left(s + (i-1)\sum_{j=2}^{d_r} \rho_j \phi(1 - (1-r)^{j-1})\right) \quad (8)$$

$$hi(s, r) = \sum_{i=2}^{d_l} \lambda_i h_i(s, r)$$

The equation (8) can be represented equivalently by the following equation (9):

$$rl = h(s, rl-1) \quad (9)$$

A condition required for deriving an SNR limit (threshold) that provides an error with a value of 0 includes rl(s)→0. In order to satisfy this condition, it is required to satisfy the following conditional expression (10):

$$r < h(s, r), \text{ all } r \in (0, \phi(s)) \quad (10)$$

In the paper by Chung et al., optimal degrees are searched for variable nodes and check nodes using the above equation in the following procedure:

(1) On the assumption that a generator function λ(x) and a Gaussian noise σn are given, a generator function ρ(x) is used as a variable to search a point that maximizes the equation (1) previously described. A constraint condition associated with this search includes normalization to ρ(x) =1 and satisfaction of the equation (7).

(2) On the assumption that a generator function ρ(x) and a Gaussian noise σn are given (as a value resulted from the step (1), for example), a generator function λ(x) is used as a variable to search a point that maximizes the equation (1). A constraint condition associated with this search includes normalization to λ(x)=1 and satisfaction of the equation (10).

(3) In order to find the maximum "rate", the steps (1) and (2) are iteratively executed to search a better ensemble of the generator function λ(x) and the generator function ρ(x) with a linear programming.

(4) Finally, signal power is normalized to 1 based on Gaussian noise σn to find an SNR limit (threshold).

$$\text{threshold (dB)} = -10 * \log 10^{(2 * \sigma_n^2)} \quad (11)$$

A problem is found in the paper of Chung et al. because a check matrix derived from the maximum of the "rate (coding rate)" is flux. Such the check matrix is not suitable for practical design because the rate fixed in design as a spec varies. In addition, the Gaussian Approximation iteratively executes the derivation of the degree distribution associated with variable nodes and the derivation of the degree distribution associated with check nodes over certain times. Therefore, a problem arises because it takes a time to some extent for searching.

The present invention provides a method to search easily and in a short time a definite and characteristic-stabilized check matrix for "Irregular-LDPC Codes". FIG. 1 is a flowchart of the method of generating check matrixes for LDPC codes according to a first embodiment of the present invention.

In step S1, it is assumed that the "rate" is given. That is, a requisite "rate" is fixed because a target "rate" is often designated previously in practical design.

In step S2, a generator function λ(x) and a generator function ρ(x) are simultaneously used as variables, and a linear programming is employed to search optimal generator functions λ(x) and ρ(x) that maximize the Gaussian noise σn. A constraint condition associated with this search includes normalization to λ(1)=1, ρ(1)=1 and satisfaction of the equation (10).

Thus, the linear programming is employed once to find such generator functions λ(x) and ρ(x) that satisfy the equations (9) and (10). Therefore, it is possible to search a definite and characteristic-stabilized check matrix for LDPC codes more easily in a shorter time than the method described in the paper that iteratively executes derivation of the generator functions λ(x) and ρ(x) to derive both optimal values.

The method of generating check matrixes for LDPC codes according to a second embodiment of the present invention applies Euclid geometric codes in the first embodiment and divides arrangement of "1"s on one row or one column to generate a check matrix for "Irregular-LDPC Codes".

The method of generating check matrixes for "Irregular-LDPC Codes" in the first embodiment is employed first to derive an ensemble of generator functions λ(x) and ρ(x). FIG. 2 illustrates an ensemble of a generator function λ(x) and a generator function ρ(x) with the rate=0.5. In this ensemble, σGA denotes a noise distribution value on the "threshold" derived by Gaussian Approximation; SNRnorm(GA) denotes a difference between an SNR on the "threshold" derived by Gaussian Approximation and an SNR on Shannon limit; x denotes a weight; and λx and ρx weight distributions associated with variable nodes and check nodes, respectively.

It is assumed that reference Euclid geometric codes are expressed as EG(2, 25), and dl=32. A value of x in the weight distribution λx and a value of x in the weight distribution ρx are determined as those that can configure 32(dl) in combination.

Figure 3:
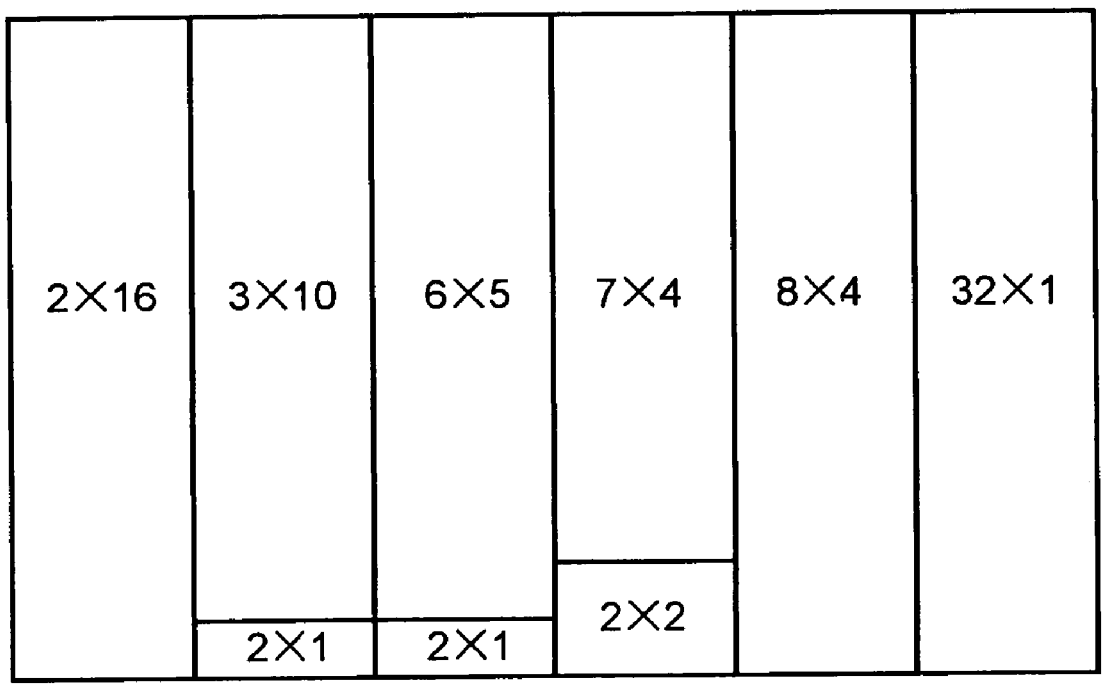
FIG. 3 illustrates a division table for EG(2, 25) when dl is assumed to be 32.

FIG. 3 illustrates a division table for EG(2, 25) with dl=32. As shown in FIG. 3, values of x in FIG. 2 can be combined always to have a value of 32. For example, a shown combination of 7×4 and 2×2 indicates that a column with a weight of 32 can be divided into four columns with a weight of 7 and two columns with a weight of 2. Thus, when EG(2, 25) codes are used as basic codes to divide appropriately each row and column with a weight of 32 as shown in FIG. 3, a check matrix for "Irregular-LDPC Codes" can be configured.

Prior to such the dividing process, the weight distributions in the ensemble of generator functions λ(x) and ρ(x) shown in FIG. 2 are subjected to adjustment in the following procedures. FIG. 4 illustrates a table for adjusting a weight distribution. Euclid geometric codes EG(2, 25) are composed of 1023 rows×1023 columns.

(1) The ensemble of the generator functions λ(x) and ρ(x) (see FIG. 4) found through Gaussian Approximation is set in the table on the second column and the third column.

(2) The weight distributions λx and ρx (the third column) are multiplied by the total number of "1"s, TP=32736, in the entire matrix at EG(2, 25) to find the total weight number of weight units, and the total weight number of weight units and a sum thereof are set on the fourth column.

(3) The total weight number of weight units (on the fourth column) is divided by the corresponding weight of x to find the total column number of weight units, which is set on the fifth column.

(4) If the total column number of weight units contains a fraction after the decimal point, a rounding process (such as rounding off, rounding up, and rounding down) is performed, and the rounded result is set on the sixth column.

(5) The rounded total column number of weight units (on the sixth column) is multiplied by the corresponding weight of x to find the total column number of weight units after the rounding process, which is set on the seventh column. It is then determined whether each sum of the total column numbers (a total row on the seventh column) is equal to the total number of "1"s in the matrix (TP=32736).

(6) If it is not equal to the total number of "1"s in the matrix, the rounded total column number of weight units (on the seventh column) is adjusted on an integer basis, and the adjusted result is set on the eighth column. In this case, the sum on the eighth column is adjusted to have a value equal to the total number of "1"s in the matrix (TP=32736).

(7) The adjusted total weight number of weight units (on the eighth column) is divided by the corresponding weight of x to find the adjusted total column number of weight units, which is set on the ninth column. Each adjusted weight distribution (on the eleventh column) is determined to have a value as close to the value found through Gaussian Approximation (on the third column) as possible.

FIG. 5 illustrates an ensemble of a generator function λ(x) and a generator function ρ(x) after the weight distribution.

A procedure of dividing one row or one column in Euclid geometric codes is explained next.

The paper of Y. Kou et al. proposes to perform the dividing based on certain rules. FIG. 6 illustrates the dividing procedure proposed in the paper of Kou et al. As shown in FIG. 6, a matrix is numbered with column numbers 1, 2, 3 . . . in sequence from the left end and row numbers 1, 2, 3 . . . in sequence from the top. For example, 32 points×1 row can be divided into 8 points×4 rows regularly in accordance with the following equation (12):

$$Sm(n)=Bl(m+4*n) \tag{12}$$

where m=1, 2, 3, 4; n=0, 1, 2, 3, 4, 5, 6, 7; and l denotes a column number in EG(2, 25). Bl(x) denotes a position of "1" on the l-th column in EG(2, 25), and Sm(n) a position of "1" on the m-th column in the divided matrix.

Specifically, a row number indicative of a position of "1" on a row in EG(2, 25) is represented by:

B1 (x)={1 32 114 136 149 223 260 382 402 438 467 507 574 579 588 622 634 637 638 676 717 728 790 851 861 879 947 954 971 977 979 998}

As a result, extracting a number indicative of "1" from Bl(x) regularly, row numbers indicative of positions of "1" on the 1st to 4th columns in the divided matrix are represented by:

S1 (n)={1 149 402 574 634 717 861 971}
S2 (n)={32 223 438 579 637 728 879 977}
S3 (n)={114 260 467 588 638 790 947 979}
S4 (n)={136 382 507 622 676 851 954 998}

Thus, 32 points×1 row can be divided into 8 points×4 rows.

On the other hand, in the dividing procedure according to the present embodiment, Euclid geometric codes are not divided regularly as described above. Rather, a number indicative of "1" is extracted from Bl(x) at random. Any extracting process may be applied so long as it can retain randomness.

Accordingly, on the m-th column in the divided matrix, an exemplary position of "1", Rm(n), is represented by:

R1 (n)={1 114 574 637 851 879 977 979}
R2 (n)={32 136 402 467 588 728 861 971}
R3 (n)={149 260 382 438 579 638 717 998}
R4 (n)={223 507 622 634 676 790 947 954}

Figure 7:
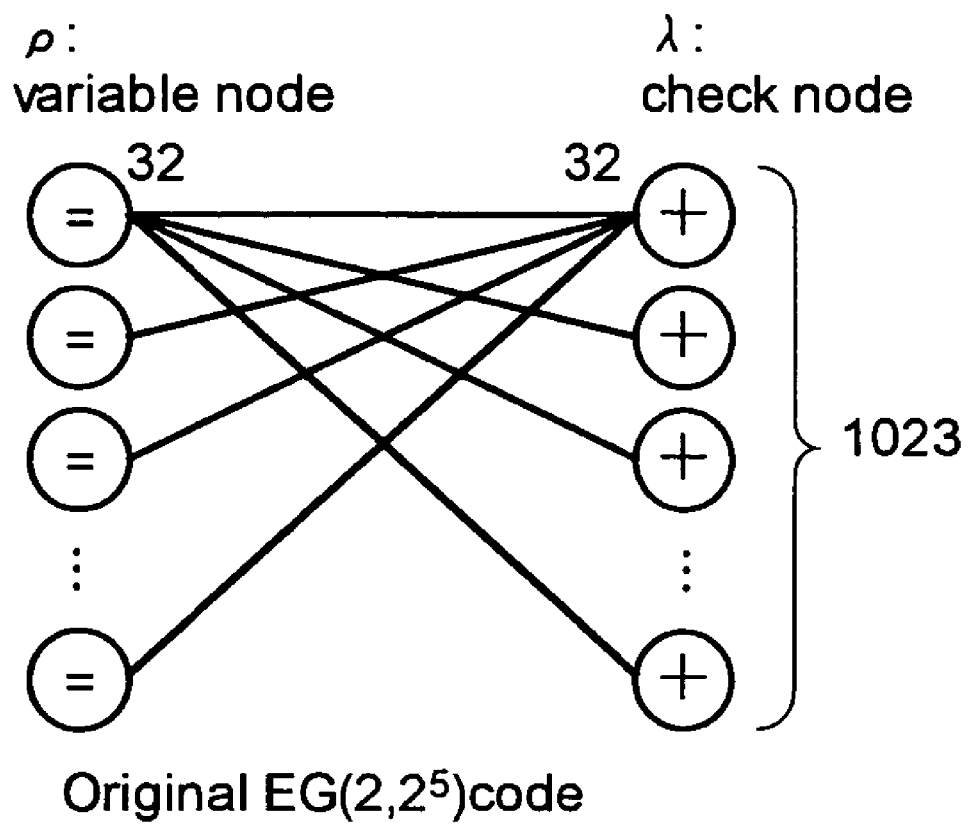
FIG. 7 is a graph of EG(2, 25) before division.
Figure 8:
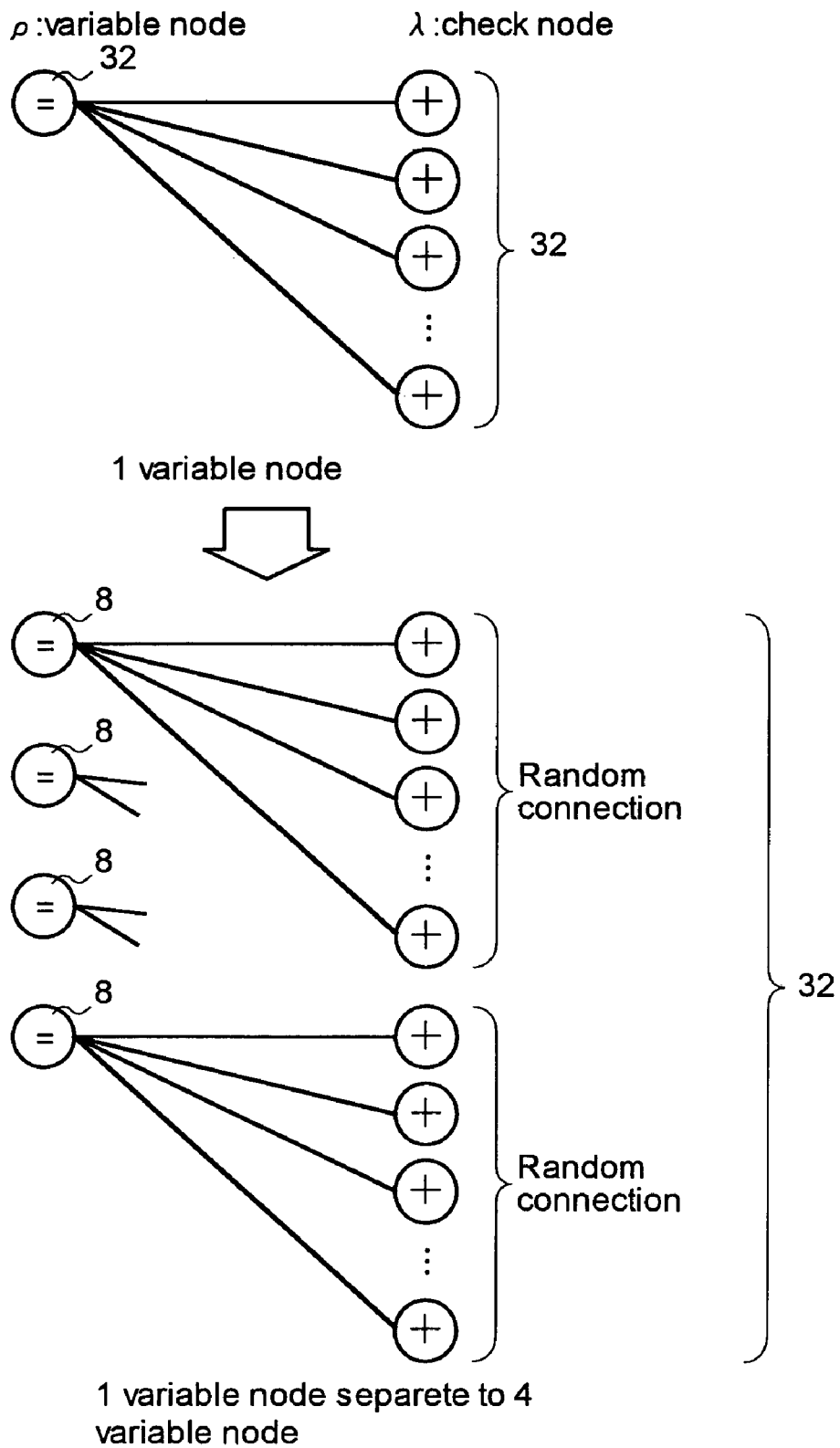
FIG. 8 is a graph of EG(2, 25) after the division.

The dividing procedure of the present embodiment can be expressed on a graph as follows. FIG. 7 illustrates a graph of EG(2, 25) before division. A line connecting both nodes is expressed as an edge. FIG. 7 shows Euclid geometric codes in 1023 rows×1023 columns (with each row/column weight of 32) before division. FIG. 8 illustrates a graph after the division, which selects edges from EG(2,25) at random.

Figure 9:
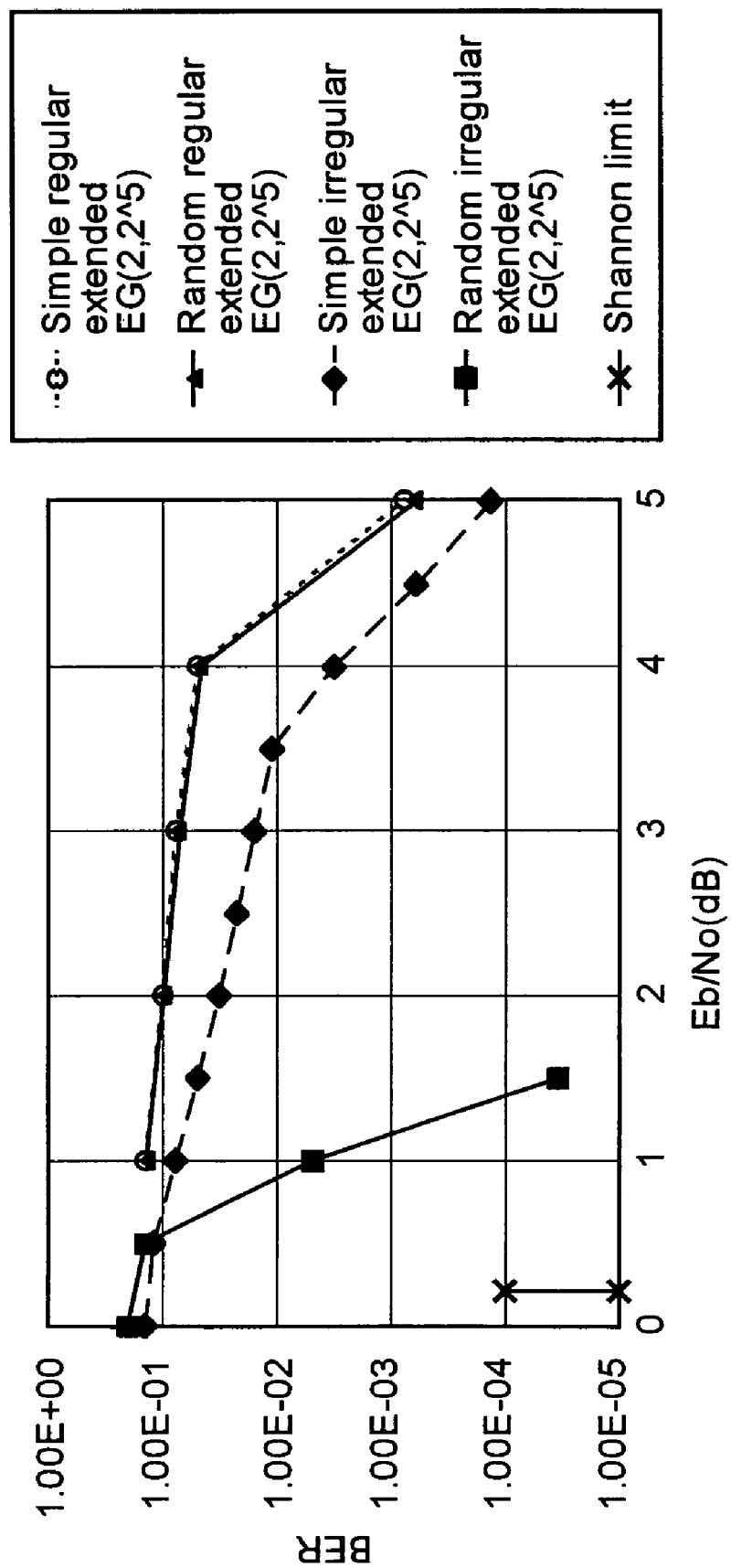
FIG. 9 illustrates a relation between Eb/No and bit error rate.

Characteristics of the LDPC codes previously described are compared below. FIG. 9 illustrates a relation between an Eb/No (Signal power to Noise power per information bit).to a bit error rate (hereinafter, "BER"). The number of iteration is equal to 50 times. The decoding method is a "Sum-Product Algorithm".

"Simple regular extended EG(2,25) correspond to "Regular-LDPC Codes" with rate=0.5 when a regular column division in EG(2,25) proposed by Y. Kou et al. is performed.

"Random regular extended EG(2,25) correspond to "Regular-LDPC Codes" with rate=0.5 when a random column division in EG(2,25) according to the present embodiment is performed. FIG. 10 illustrates an ensemble of these "Regular-LDPC Codes". "Simple irregular extended EG(2,25) correspond to "Irregular-LDPC Codes" with rate=0.5 when a regular column division in EG(2,25) proposed by Y. Kou et al. is performed to the ensemble specified in the method of the first embodiment. "Random irregular extended EG(2,25) correspond to "Irregular-LDPC Codes" with rate=0.5 when a random column division in EG(2,25) according to the present embodiment is performed to the ensemble specified in the method of the first embodiment. FIG. 11 illustrates an ensemble of these "Irregular-LDPC Codes".

As can be seen from FIG. 9, "Irregular-LDPC Codes" have a better performance than that of "Regular-LDPC Codes" at the same rate. The regular division proposed in the paper of Y. Kou et al. can not allow a larger improvement even with "Irregular-LDPC Codes". In contrast, the random division of the present embodiment can provide a remarkably improved performance when it is implemented.

An example of the random division is detailed next. A random sequence is generated easily and definitely for the random division. This method has an advantage because the sending side and the receiving side can generate the same random sequence. This is extremely important in a practical system. There is another advantage because a condition associated with code characteristics can be defined correctly.

(1) Creation of basic random sequences:

An example of random sequence creation is described below using Euclid geometric codes EG(2,24) for convenience of explanation. In Euclid geometric codes EG(2,24), the number of "1"s present in a row is equal to 24.

When P is used for the minimum prime number that satisfies $P \geq 2s$, for example, P=17 in the case of 24. A basic random sequence C(i) with a sequence length, P−1=16, is created in accordance with the equation (13):

$$C(1)=1$$

$$C(i+1)=G0 \times C(i) \bmod P \quad (13)$$

where i=1, ..., P−1; and G0 denotes an original source of Galois Field GF(P). As a result, C(i) is represented by:

C (i)={1 3 9 10 13 5 15 11 16 14 8 7 4 12 2 6}

In the case of 24, P has a value equal to 24+1, which yields a random sequence length of 16 without any problem. In the case of 25, however, P has a value equal to 25+1, which yields a random sequence length above 25. In order to meet such the case, numeric values over 25 are deleted from the random sequence.

Figures 12, 13:
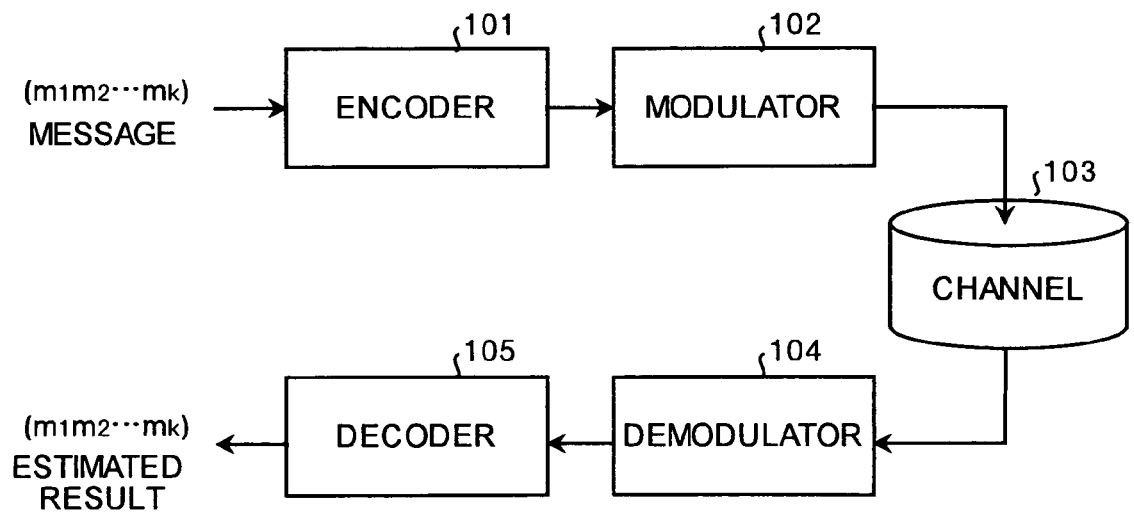
FIG. 12 illustrates a Latin square of random sequences.
FIG. 13 illustrates an LDPC encoding/decoding system.
Figure 14:
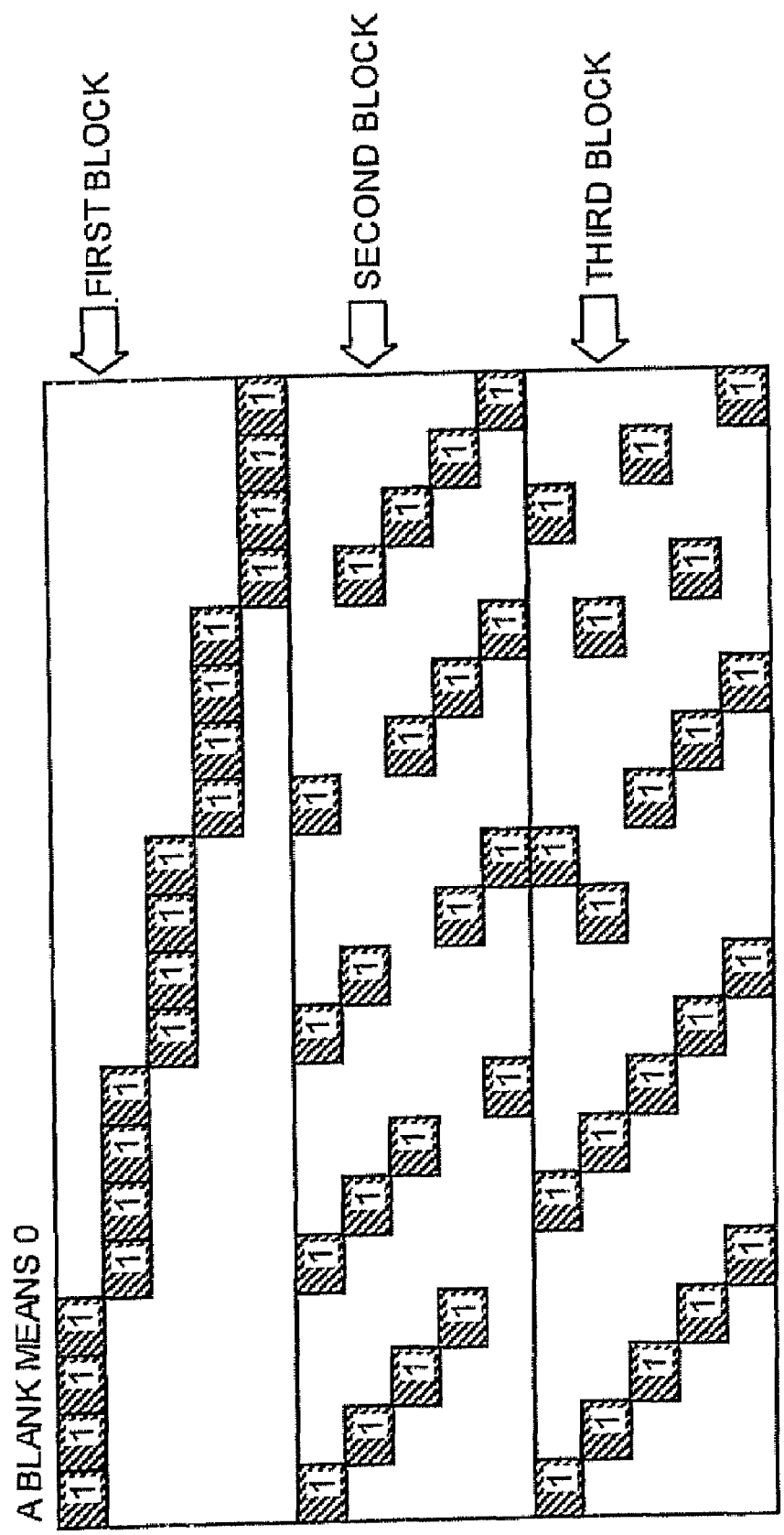
FIG. 14 illustrates the conventional check matrix for LDPC codes.
Figure 15:
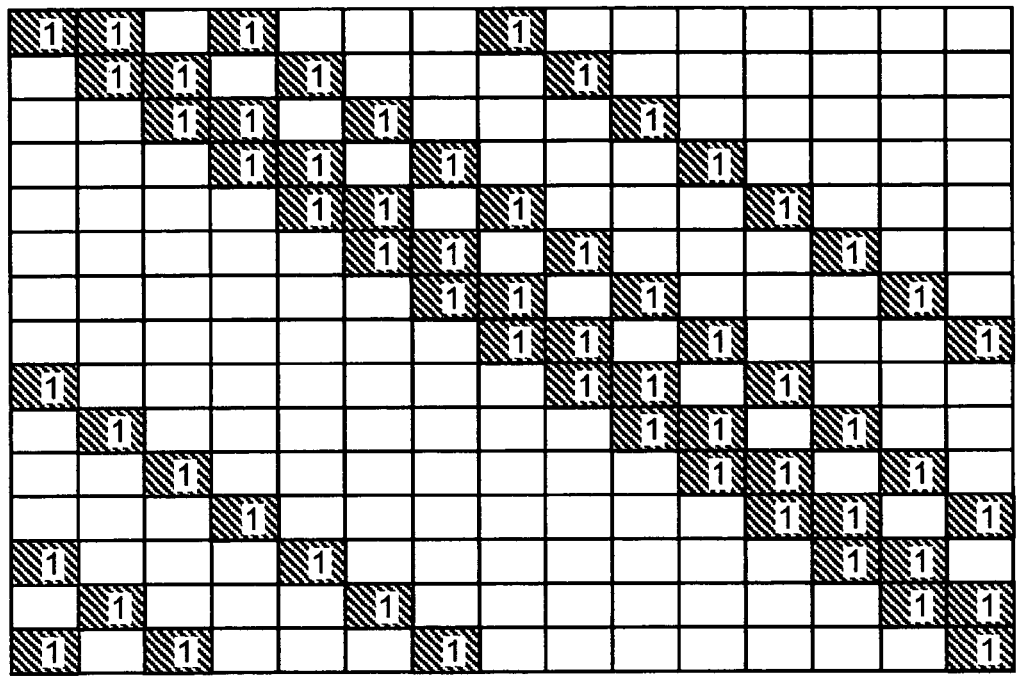
FIG. 15 illustrates a configuration of Euclid geometric codes EG(2, 22)
Figure 16:
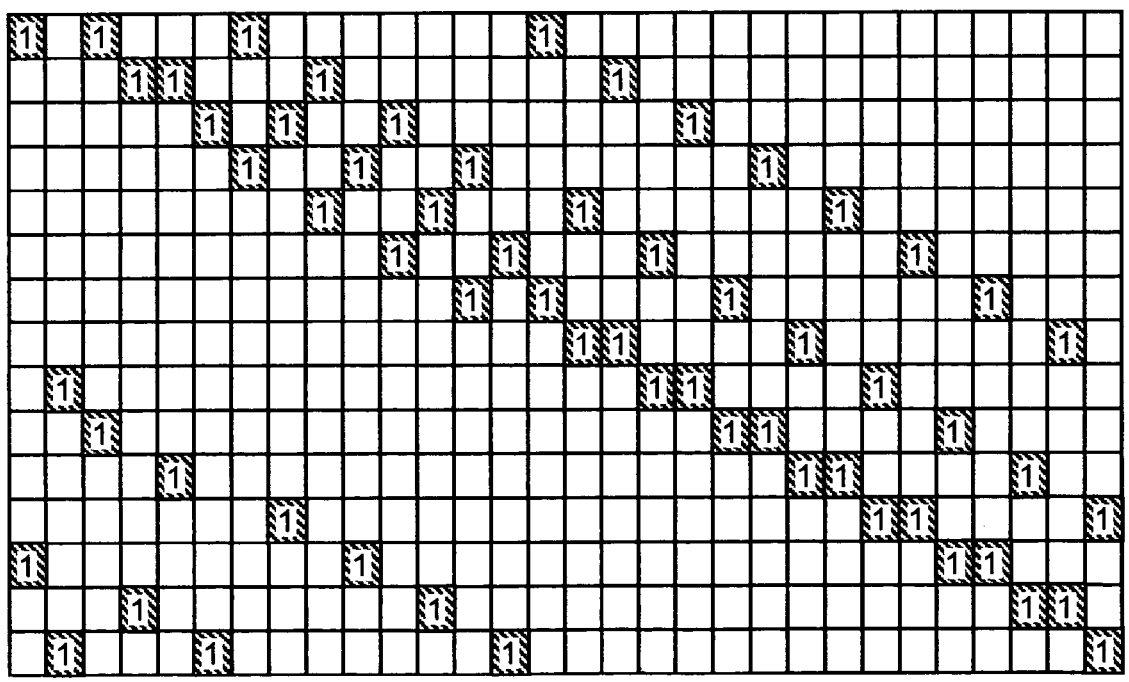
FIG. 16 illustrates an exemplary row weight regularly separated from 4 into 2.

The random sequence C(i) is then cyclically shifted to generate a Latin square of random sequences. FIG. 12 illustrates a Latin square of random sequences.

(2) Using the Latin square of random sequences, from an arrangement B1(x) with a row number indicative of a position of "1" on the 1st column in Euclid geometric codes EG(2,24), a number indicative of "1" is extracted at random to divide the 1st column in Euclid geometric codes. The arrangement B1(x) is represented by:

B1 (x)={1 14 16 19 45 49 55 107 115 126 127 182 210 224 231 247}

For example, if the 1st column in Euclid geometric codes is divided into four (such that each column has a weight of 4), four random sequences L1(n) to L4(n) are extracted from the 1st row in the Latin square of random sequences.

L1 (n)={1, 3, 9, 10}
L2 (n)={13, 5, 15, 11}
L3 (n)={16, 14, 8, 7}
L4 (n)={4, 12, 2, 6}

Using the four random sequences L1(n) to L4(n), a number indicative of "1" is extracted from the arrangement B1(x) at random. As a result, R(L1(n)) to R(L4(n)) are given as:

R (L1 (n))={1, 16, 115, 126}
R (L2 (n))={210, 45, 231, 127}
R (L3 (n))={247, 224, 107, 55}
R (L4 (n))={19, 182, 14, 49}

(3) Similarly, using the Latin square of random sequences, from an arrangement B2(x) at a row number indicative of a position of "1" on the 2nd column in Euclid geometric codes EG(2,24), a number indicative of "1" is extracted at random to divide the 2nd column in Euclid geometric codes. The arrangement B2(x) is represented by:

B2 (x)={2 15 17 20 46 50 56 108 116 127 128 183 211 225 232 248}

For example, if the 2nd column in Euclid geometric codes is divided into four (such that each column has a weight of 4), four random sequences L1(n) to L4(n) are extracted from the 2nd row in the Latin square of random sequences.

L5 (n)={3, 9, 10, 13}
L6 (n)={5, 15, 11, 16}
L7 (n)={14, 8, 7, 4}
L8 (n)={12, 2, 6, 1}

Using the four random sequences L5(n) to L8(n), a number indicative of "1" is extracted from the arrangement B2(x) at random. As a result, R(L5(n)) to R(L8(n)) are given as:

R (L5 (n))={17, 116, 127, 211}
R (L6 (n))={46, 232, 128, 248}
R (L7 (n))={225, 108, 56, 20}
R (L8 (n))={183, 15, 50, 2}

All other columns in Euclid geometric codes are divided similarly in the same procedures.

(4) If the Latin square of random sequences lacks in random sequences, a prime number larger than the original source and less than 2s is substituted for the basic random sequence G0 in the equation (13) to create a new basic random sequence and divide it with the same procedure.

Another method of creating a Latin square of random sequences is explained next using Euclid geometric codes EG(2,25) for convenience of explanation. In Euclid geometric codes EG(2,25), the number of "1"s present in a row is equal to 25.

In the previous example of EG(2,24), the created Latin square of 16 (rows)×16 (columns) may lack in random sequences. In the present example of EG(2,25), it is extended to 32 (rows)×960 (columns). This matrix has a size determined by 30 sets of Latin squares of 32 (rows)×32 (columns) arranged in the column direction.

In the previous example, P is used for the minimum prime number that satisfies $P \geq 2s$. In the present example, P is used for the maximum prime number that satisfies $P \geq 2s$. For example, P=31 in the case of 25.

A basic random sequence C(i) with a sequence length, P=31, is created in accordance with the equation (14):

$$C(1)=0$$

$$C(i+1)=G0 \times C(i) \bmod P \quad (14)$$

where i=1, ..., P−1; and G0 denotes an original source of Galois Field GF(P). As a result, C(i) is represented by:

C (i)={0, 1, 3, 9, 27, 19, 26, 17, 20, 29, 25, 13, 8, 24, 10, 30, 28, 22, 4, 12, 5, 15, 14, 11, 2, 6, 18, 23, 7, 21}

The following operation is given next.

$$C(i)=C(i)+1, C(32)=32$$

As a result, C(i) is represented by:

C (i)={1, 2, 4, 10, 28, 20, 27, 17, 18, 21, 30, 26, 14, 9, 25, 11, 31, 29, 23, 5, 13, 6, 16, 15, 12, 3, 7, 19, 24, 8, 22, 32}

Figure 17:
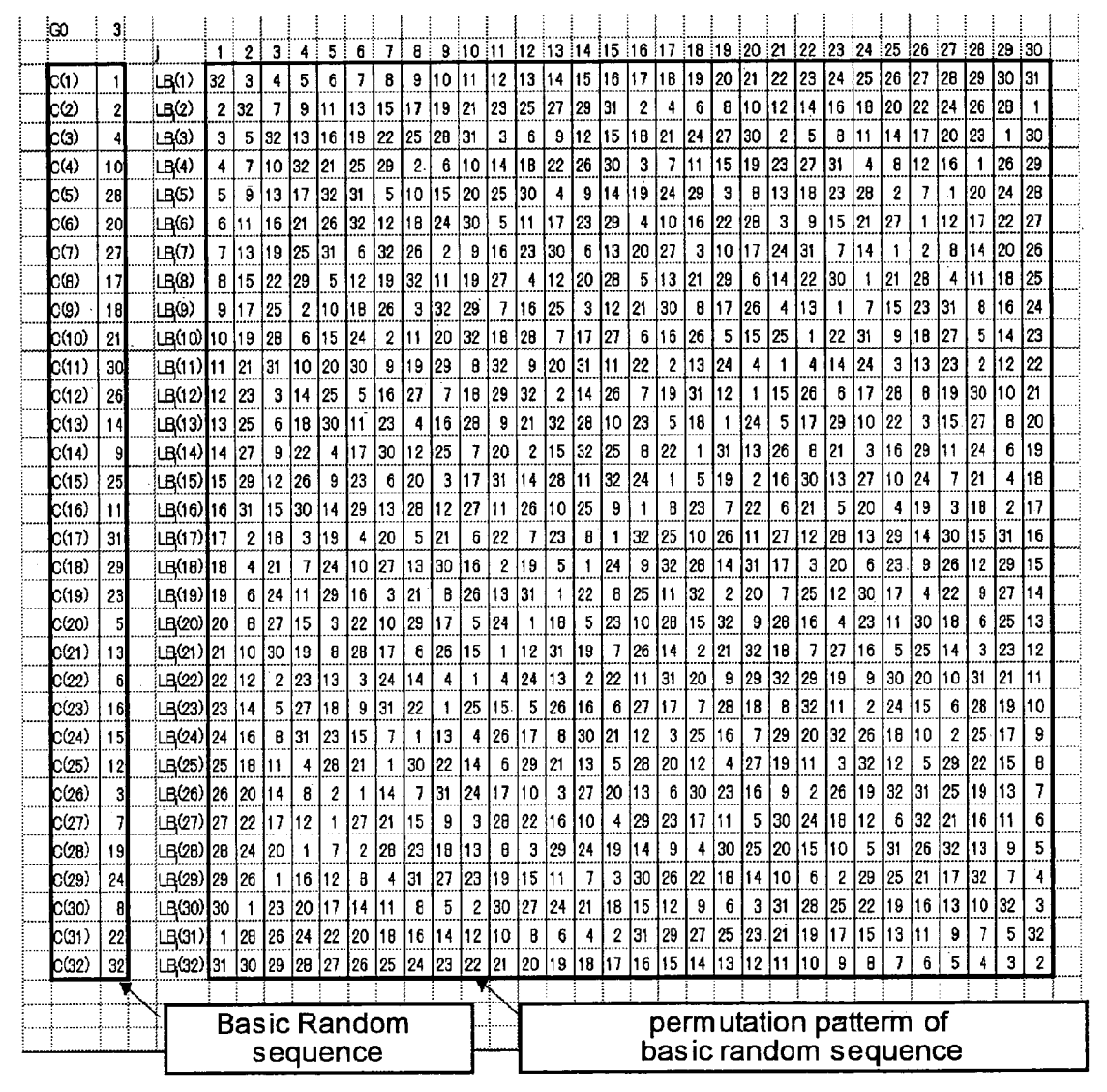

This result is shown as a basic random sequence within a thick-lined frame at the left side in FIG. 17.

The following explanation is given to a method of reading the random sequence of C(i) at a certain interval, S(j), where j=1, 2, ..., P−1, with possible P−1 variations. In this case, P−1=30.

S (j)={1, 2, 3, 4, 5, 6, 7, 8, 9, 10, 11, 12, 13, 14, 15, 16, 17, 18, 19, 20, 21, 22, 23, 24, 25, 26, 27, 28, 29, 30}

If a sequence $LB_j(i)$ is given for reading the random sequence at a certain interval, then $LB_j(i)=((S(j)*i) \mod P)+1$ where j=1, 2, ..., P−1; and i=1, 2, ..., P−1.

For example, if j=1, then

LB1 (i)={2, 3, 4, 5, 6, 7, 8, 9, 10, 11, 12, 13, 14, 15, 16, 17, 18, 19, 20, 21, 22, 23, 24, 25, 26, 27, 28, 29, 30, 31}

This example lacks integers of 1 and P through 2s for the sequence number of random sequences, 32. In this case, integers of 1 and 32 are lacked. Then, LBj(j)=32, LBj(32−j)=1 can be inserted to yield:

LB1 (i)={32, 2, 3, 4, 5, 6, 7, 8, 9, 10, 11, 12, 13, 14, 15, 16, 17, 18, 19, 20, 21, 22, 23, 24, 25, 26, 27, 28, 29, 30, 1, 31}

Similarly, if j=2,

LB2 (i)={3, 32, 5, 7, 9, 11, 13, 15, 17, 19, 21, 23, 25, 27, 29, 31, 2, 4, 6, 8, 10, 12, 14, 16, 18, 20, 22, 24, 26, 1, 28, 30}

Now, creation of a Latin square is started. Ljq(i) denotes a sequence on the q-th column in the j-th Latin square. If Ljq(i)=LBj(i), then L11 (i)=C (LB1 (i) )=
{32, 2, 4, 10, 28, 20, 27, 17, 18, 21, 30, 26, 14, 9, 25, 11, 31, 29, 23, 5, 13, 6, 16, 15, 12, 3, 7, 19, 24, 8, 1, 22}

This corresponds to L11(i) on the 1st column in FIG. 18.

This random sequence L11 (i) is cyclically shifted to create a Latin square L1q(i) of 32 (rows)×32 (columns). In the similar procedure, Latin squares L2q(i), L3q(i), ..., L30q(i) are created to produce a combination of Latin squares, 32 (rows)×(32×30) (columns).

A specific example is explained below. From an arrangement B1(x) with a row number indicative of a position of "1" on the 1st column in Euclid geometric codes EG(2, 25), a number indicative of "1" is extracted at random to decompose the 1st column in Euclid geometric codes. The arrangement B1(x) is represented by:

B1 (x)={1 32 114 136 149 223 260 382 402 438 467 507 574 579 588 622 634 637 638 676 717 728 790 851 861 879 947 954 971 977 979 998}

For example, if the 1st column in Euclid geometric codes is divided into four (such that each column has a weight of 8), four random sequences L1(n) to L4(n) are extracted from the 1st column in the 1st Latin square in the combination of Latin squares of random sequences, Ljq(i).

L1 (n)={32, 2, 4, 10, 28, 20, 27, 17}
L2 (n)={18, 21, 30, 26, 14, 9, 25, 11}
L3 (n)={31, 29, 23, 5, 13, 6, 16, 15,}
L4 (n)={12, 3, 7, 19, 24, 8, 1, 22}

Using the four random sequences L1(n) to L4(n), a number indicative of "1" is extracted from the arrangement B1(x) at random. As a result, R(L1(n)) to R(L4(n)) are given as:

R(L1 (n))={998, 32, 136, 438, 954, 676, 947, 634}
R(L2 (n))={637, 717, 977, 879, 579, 402, 861, 467}
R(L3 (n))={979, 971, 790, 149, 574, 223, 622, 588}
R(L4 (n))={507, 114, 260, 638, 851, 382, 1, 728}

All other columns in Euclid geometric codes are divided similarly in the same procedures.

As explained above, according to one aspect of the present invention, the generator function λ(x) and the generator function ρ(x) are calculated in one linear programming. Therefore, it is possible to search definite and characteristic-stabilized check matrix for LDPC codes more easily and speedily than the method described in the paper that iteratively executes derivation of the generator functions λ(x) and ρ(x) to derive both optimal values.

Moreover, the better characteristics are obtained than "Regular-LDPC Codes" at the same rate. The regular division can not allow a larger improvement even with "Irregular-LDPC Codes". In contrast, the random division can remarkably improve performance.

Furthermore, a weight distribution is adjusted such that the total weight number of weight units is equal to an integer, and a sum of the total weight numbers of weight units is equal to the total number of "1"s in Euclid geometric codes. This realizes more accurate dividing process.

Moreover, the sending side and the receiving side can generate the same random sequence. Also, a condition associated with code characteristics can be defined correctly through creation of a Latin square of random sequences.

Moreover, the sending side and the receiving side can generate the same random sequence. Also, a condition associated with code characteristics can be defined correctly through creation of a plurality of Latin squares of random sequences.

INDUSTRIAL APPLICABILITY

As obvious from the forgoing, the method of generating check matrixes for LDPC codes according to the present invention is effective as an error control technology for a LDPC encoding/decoding system that employs LDPC codes. In particular, it is suitable for an encoder for generating definite and characteristic-stabilized "Irregular-LDPC codes" and a communication device equipped with the encoder.

The invention claimed is:

1. A method of generating check matrixes for Low-Density Parity-Check codes to derive a threshold of Signal to Noise Ratio that provides an error with a value of 0 by analyzing a Sum Product Algorithm for the Low-Density Parity-Check codes, on an assumption that a Log Likelihood Ratio between input/output data at a decoder is approximated in a Gaussian distribution, comprising:
   utilizing an encoder for fixing a coding rate;
   utilizing the encoder for obtaining an optimal ensemble, which is an ensemble that minimizes the threshold of Signal to Noise Ratio, of a row and a column weights in a linear programming, wherein the linear programming is employed to search optimal generator functions to maximize a Gaussian noise; and
   utilizing the encoder for generating a check matrix for the Low-Density Parity-Check codes in accordance with the ensemble obtained.

2. The method according to claim 1, further comprising extracting "1" at random from each row or each column in Euclid geometric codes based on the ensemble obtained, and
the generating includes dividing each row or each column to generate a check matrix for Irregular Low-Density Parity-Check codes.

3. The method according to claim 2, further comprising:
adjusting a weight distribution in the ensemble obtained such that the total weight number of weight units is equal to an integer, and a sum of the total weight numbers of weight units is equal to the total number of "1"s in Euclid geometric codes, wherein the dividing is performed based on the adjusted ensemble.

4. The method according to claim 3, further comprising:
creating a Latin square of basic random sequences;
dividing a random sequence on m-th row in the Latin square into code-word length n when m-th column in the Euclid geometric codes is divided into code-word length n; and
extracting "1" from the m-th column in the Euclid geometric codes using each random sequence after divided into code-word length n.

5. The method according to claim 3, further comprising:
creating a Latin square of basic random sequences;
dividing a random sequence on m-th row in the Latin square into code-word length n when m-th row in the Euclid geometric codes is divided into code-word length n; and
extracting "1" from the m-th row in the Euclid geometric codes using each random sequence after divided into code-word length n.

6. The method according to claim 3, further comprising:
creating a plurality of Latin squares of basic random sequences;
using a Latin square group matrix linked in the column direction;
dividing a random sequence on m-th column in the Latin square group matrix into code-word length n when m-th column in the Euclid geometric codes is divided into code-word length n; and
extracting "1" from the m-th column in the Euclid geometric codes using each random sequence after divided into code-word length n.

7. The method according to claim 3, further comprising:
creating a plurality of Latin squares of basic random sequences;
using a Latin square group matrix linked in the column direction;
dividing a random sequence on m-th column in the Latin square group matrix into code-word length n when m-th row in the Euclid geometric codes is divided into code-word length n; and
extracting "1" from the m-th row in the Euclid geometric codes using each random sequence after divided into code-word length n.

8. An apparatus for generating check matrixes for Low-Density Parity-Check codes to derive a threshold of Signal to Noise Ratio that provides an error with a value of 0 by analyzing a Sum Product Algorithm for the Low-Density Parity-Check codes, on an assumption that a Log Likelihood Ratio between input/output data at a decoder is approximated in a Gaussian distribution, comprising:
an encoder to
fix a coding rate;
obtain an optimal ensemble, which is an ensemble that minimizes the threshold of Signal to Noise Ratio, of a row and a column weights in a linear programming, wherein the linear programming is employed to search optimal generator functions to maximize a Gaussian noise; and
generate a check matrix for the Low-Density Parity-Check codes in accordance with the ensemble obtained.

9. The apparatus according to claim 8, wherein the encoder further extracts "b 1" at random from each row or each column in Euclid geometric codes based on the ensemble obtained, and
divides each row or each column to generate a check matrix for Irregular Low-Density Parity-Check codes.

10. The apparatus according to claim 9, wherein the encoder further adjusts a weight distribution in the ensemble obtained such that the total weight number of weight units is equal to an integer, and a sum of the total weight numbers of weight units is equal to the total number of "1"s in Euclid geometric codes, and
divides each row or each column to generate a check matrix for Irregular Low-Density Parity-Check codes based on the adjusted ensemble.

11. The apparatus according to claim 10, wherein the encoder further creates a Latin square of basic random sequences;
divides a random sequence on m-th row in the Latin square into code-word length n when m-th column in the Euclid geometric codes is divided into code-word length n; and
extracts "1" from the m-th column in the Euclid geometric codes using each random sequence after divided into code-word length n.

12. The apparatus according to claim 10, wherein the encoder further creates a Latin square of basic random sequences;
divides a random sequence on m-th row in the Latin square into code-word length n when m-th row in the Euclid geometric codes is divided into code-word length n; and
extracts "1" from the m-th row in the Euclid geometric codes using each random sequence after divided into code-word length n.

13. The apparatus according to claim 10, wherein the encoder further creates a plurality of Latin squares of basic random sequences;
uses a Latin square group matrix linked in the column direction;
divides a random sequence on m-th column in the Latin square group matrix into code-word length n when m-th column in the Euclid geometric codes is divided into code-word length n; and
extracts "1" from the m-th column in the Euclid geometric codes using each random sequence after divided into code-word length n.

14. The apparatus according to claim 10, wherein the encoder further creates a plurality of Latin squares of basic random sequences;
uses a Latin square group matrix linked in the column direction;
divides a random sequence on m-th column in the Latin square group matrix into code-word length n when m-th row in the Euclid geometric codes is divided into code-word length n; and
extracts "1" from the m-th row in the Euclid geometric codes using each random sequence after divided into code-word length n.

* * * * *